United States Patent [19]
Wu

[11] Patent Number: 5,913,118
[45] Date of Patent: Jun. 15, 1999

[54] METHOD OF MANUFACTURING TRENCH DRAM CELLS WITH SELF-ALIGNED FIELD PLATE

[75] Inventor: Shye-Lin Wu, Hsinchu, Taiwan

[73] Assignee: Texas Instruments-Acer Incorporated, Hsinchu, Taiwan

[21] Appl. No.: 08/990,117

[22] Filed: Dec. 12, 1997

[30] Foreign Application Priority Data

Aug. 28, 1997 [TW] Taiwan ................................. 86112555

[51] Int. Cl.⁶ .............................................. H01L 21/8242
[52] U.S. Cl. ........................................... 438/243; 438/246
[58] Field of Search .................................. 438/243–249, 438/386–392; 257/301

[56] References Cited

U.S. PATENT DOCUMENTS 5,111,259  5/1992  Teng et al. .
5,432,113  7/1995  Tani .

Primary Examiner—Jey Tsai
Attorney, Agent, or Firm—Harness, Dickey & Pierce, P.L.C.

[57] ABSTRACT

A silicon oxide, a silicon nitride layer are patterned to define trenches region. Then, a recess portion is formed in the substrate. Subsequently, a second silicon oxide, a second silicon nitride layer are formed on the recess portion. Then, a glass layer is formed on the second silicon nitride layer and refilled into the recess portion. An etching step is performed to etch the glass layer, the second silicon nitride layer and the second silicon oxide layer to the surface of the substrate. Trenches are then created in the substrate. Then, ion implantation processes are performed to dope ions into the trenches. A dielectric layer is then deposited along the surface of the trenches and on the surface of the second silicon oxide layer, the second silicon nitride layer. A polysilicon layer is deposited on the dielectric layer and refilled into the trenches. Then, an etching back is used to etch the polysilicon layer to form a field plate. Successively, a thermal process is carried out to form an oxide layer on the field plate. Next, side-wall spacers are formed on the side walls of the field plate, and the oxide layer.

34 Claims, 8 Drawing Sheets

METHOD OF MANUFACTURING TRENCH DRAM CELLS WITH SELF-ALIGNED FIELD PLATE

FIELD OF THE INVENTION

The present invention relates to a method of fabricating a semiconductor device, and more specifically, to a method of forming a Dynamic Random Access Memory (DRAM) cell. Still more particularly, the present invention relates to a method of forming trench capacitors for DRAM cells.

BACKGROUND

In recent years, the development of semiconductor devices has a trend that towards to increase the packing density on a chip. Thus, the development of a high density memory cell is being carried out. Typically, the DRAM cells are applied to store data for a computer. These semiconductor memory devices have large capacitance for reading out and storing of information. Dynamic Random Access Memories are so named because their cells can retain information only temporarily, even with power continuously applied. The cells must therefore be read and refreshed at periodic intervals. A memory cell is provided for each bit stored by the DRAM device. Each memory cell typically consists of a storage capacitor and an access transistor. Generally, the formation of a DRAM memory cell includes the formation of a transistor, a capacitor and contacts to external circuits.

In order to achieve high density DRAM devices, the memory cells must be scaled down in size to the submicrometer range. This causes reduction in capacitor area, resulting in the reduction of cell capacitance. Therefore, the capacitance of a capacitor becomes relatively small. This decrease in storage capacitance leads to lower signal-to-noise ratios and increase errors due to alpha particle interference. Prior art approaches to overcome these problems have resulted in the development of the trench capacitor. Specially, the trench capacitor has larger aspect ratio. See "Trench Storage Node Technology for Gigabit DRAM Generations, K. P. Muller et al., 1996, IEEE, IEDM 96-507".

The trench capacitors can upgrade the capacitance and provide better topography. However, some drawbacks are related to the trench capacitors. For example, cell leakage is a serious issue in the making of the trench capacitors. The cell leakage will degrade the retention time of the DRAM cells. The retention time is one of the important parameters of DRAM cells. One of the prior arts related to the cell leakage can be seen in "Characterization of Cell Leakage of a Stacked Trench Capacitor (STT) Cell, Takeshi Hamamoto et al., 1994 IEEE". The major reason to cause the cell leakage is an etching process that is used to form the field plate of the capacitors. The field plate is damage by plasma etching, which causes amount of leakage. See "Trench Capacitor Leakage in High Density DRAM's M. ELAHY. EDL et al., 1984, IEEE ELECTRON DEVICE LETTERS, vol. EDL. 5, No. 12, pp. 527–530". and "Scalability of a Trench Capacitor Cell for 64M bit DRAM, B. W. Shin et al., 1989, IEEE, IEDM 89-27".

SUMMARY

In accordance with the present invention, a method of manufacturing a capacitor is provided. In one embodiment adapted for use in a DRAM cell will be described as follow.

First, a thermal silicon oxide layer is formed on a substrate to act as a pad layer. A silicon nitride layer is then formed on the silicon oxide layer. Then, the silicon oxide, the silicon nitride layer are patterned by well known photolithography, leaving an exposed area where the capacitor will be formed in subsequent processes. Thus, a photoresist is patterned on the silicon nitride layer to define trenches region. Then, an ion implantation is performed using the photoresist as a mask to increase the ion concentration of the exposed area. Then, a field oxide region is formed on the exposed area. The ions doped by the first ion implantation are driven into deeper portion of the substrate by the thermal process.

The field oxide region is removed to generate a recess portion in the substrate. Subsequently, a photoresist is patterned on the first silicon nitride layer to expose the recess portion. A second silicon oxide layer is formed on the surface of the recess portion and on the first silicon nitride layer to serve as a second pad oxide. A second silicon nitride layer is formed on the second silicon oxide layer Then, a BPSG (borophosphosilicate glass) layer or spin on glass layer is formed on the second silicon nitride layer and refilled into the recess portion.

A photoresist is then patterned on the BPSG layer to expose portions of the BPSG (borophosphosilicate glass) layer. An etching step is performed to etch the BPSG layer, the second silicon nitride layer and the second silicon oxide layer to the surface of the substrate. Trenches are then created in the substrate by using the BPSG as a mask. Then, ion implantation processes are performed with at least two titled angles with respect to the normal (vertical) line of the substrate to dope n type ions into the surface of the trenches. Ion doped areas surround the surface of the trenches to act as first storage nodes of capacitors, and to form the n+/p junctions for memory cell. A dielectric layer is then deposited along the surface of the trenches and on the surface of the second silicon oxide layer, the second silicon nitride layer.

A polysilicon layer is deposited on the dielectric layer and refilled into the trenches. Then, an etching back is used to etch the polysilicon layer to form a field plate that is self-aligned on top of the polysilicon layer. Successively, a low temperature thermal process in wet oxygen steam ambient is carried out. Therefore, an oxide layer is formed on the surface of the field plate for isolation. The dielectric, the second silicon nitride layer and the first silicon nitride layer are removed to expose the first silicon oxide layer and top portions of the side walls of the polysilicon layer. Next, side-wall spacers are formed on the side walls of the field plate, and the oxide layer. The first silicon oxide is removed. Next, a silicon oxide layer is reformed on the substrate to act as a gate oxide layer for transistors. Then, a polysilicon layer is formed on the silicon oxide layer, the side-wall spacers and the oxide layer. Then, lithography and etching processes are used to form the transistors, word lines over the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to fabricate DRAM cell capacitors with self-aligned field plate. The formation of the trench DRAM cell includes many process steps that are well known in the art. For example, the processes of lithography masking and etching are used extensively in an embodiment of the present invention.

Figure 1:
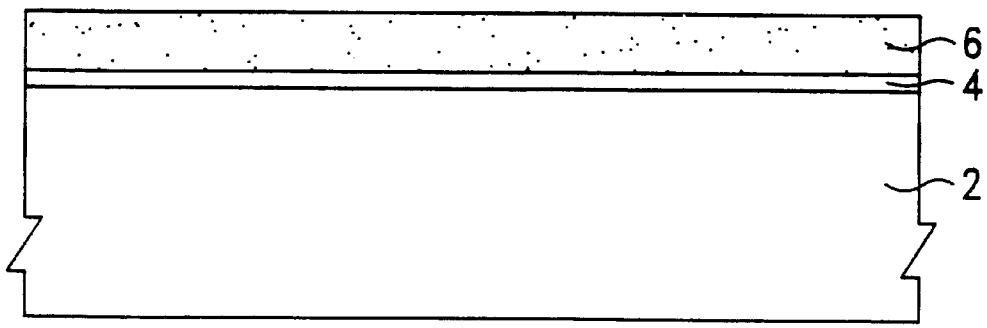
FIG. 1 is a cross-sectional view of a semiconductor wafer illustrating the steps of forming a first pad oxide and a first silicon nitride layer on a substrate according to the present invention.

Referring to FIG. 1, a single crystal silicon substrate 2 with a <100> crystallographic orientation is provided. First, a thermal silicon oxide layer 4 of 30 to hundreds angstroms is formed on the substrate 2 to act as a pad layer. The pad oxide is formed to reduce the stress between the substrate 2 and a subsequent silicon nitride layer. The pad oxide layer can also be formed by any suitable chemical vapor deposition. A silicon nitride layer 6 is then formed on the silicon oxide layer 4 to have a thickness approximate 1500–2000 angstroms. The silicon nitride layer 6 can be formed by low pressure chemical vapor deposition, plasma enhance chemical vapor deposition or high density plasma chemical vapor deposition. The reaction temperature is about 300 to 800 centigrade.

Figure 2:
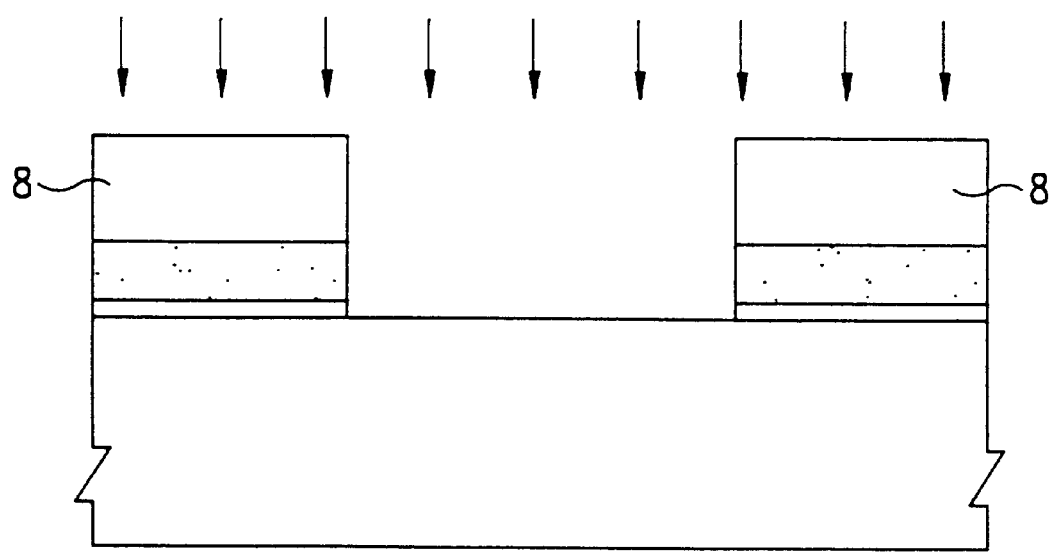
FIG. 2 is a cross-sectional view of a semiconductor wafer illustrating the steps of etching the first pad oxide and the first silicon nitride layer, and performing an ion implantation according to the present invention.

Then, turning to FIG. 2, the silicon oxide 4, the silicon nitride layer 6 are patterned by well known photolithography, leaving an exposed area where the capacitor will be formed in subsequent processes. Thus, a photoresist 8 is patterned on the silicon nitride layer 6 to define trenches region. Then, an ion implantation is performed using the photoresist 8 as a mask to increase the ion concentration of the exposed area for preventing the trench cell punch through effect. Typically, the ions are p type, such as boron, the implantation energy and the implantation dosage are respectively about 150 KeV to 2 MeV, 1E12 to 1E14 atoms/cm$^2$. After the step is completed, the photoresist 8 is removed.

Figure 3:
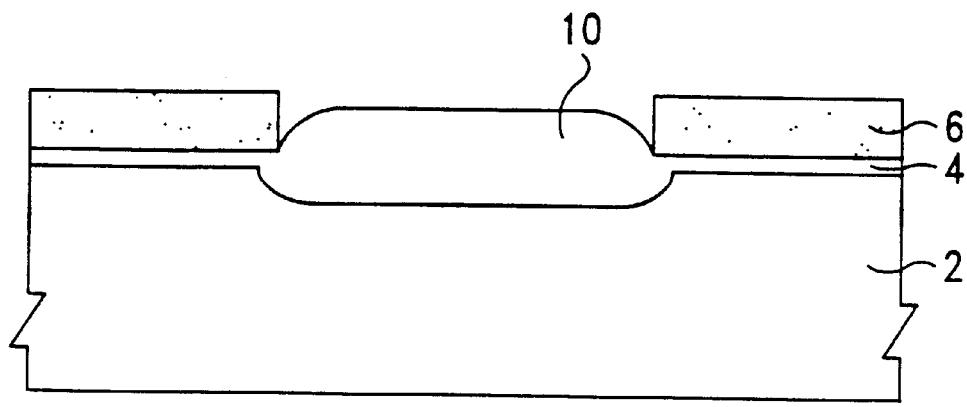
FIG. 3 is a cross-sectional view of a semiconductor wafer illustrating the step of forming a field oxide region according to the present invention.

The next step is to generate a recess portion in the substrate 2. In the preferred embodiment, a field oxide region 10 is formed on the exposed area by thermal oxidation using the first silicon nitride layer 6 as a mask. A portion of the field oxide region 10 extends into the substrate 2, as shown in the FIG. 3. The temperature of this step is about 900 to 1200 centigrade. Further, the ions doped by the first ion implantation are driven into deeper portion of the substrate 2 by the thermal process.

Figure 4:
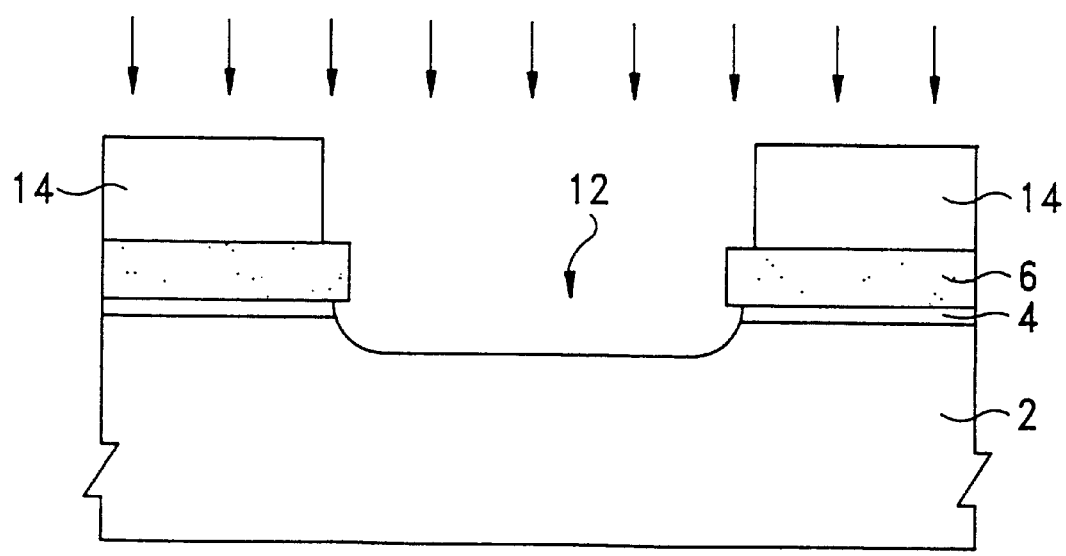
FIG. 4 is a cross-sectional view of a semiconductor wafer illustrating the steps of removing the field oxide region and performing an ion implantation according to the present invention.

Turning FIG. 4, the field oxide region 10 is removed using the first silicon nitride 6 as a mask to generate the recess portion 12 in the substrate 2. Subsequently, a photoresist 14 is patterned on the first silicon nitride layer 6 to expose the recess portion 12. Then, an ion implantation is performed with low energy to adjust the threshold voltage of the memory cells. The ions used to implant in the area are p type, such as boron or $BF_2$. The energy of the second ion implantation is about 5 to 50 KeV. Further, the dosage of the second ion implantation is about 1E12 to 5E13 atoms/cm$^2$. After the step is completed, the photoresist 14 is removed. If the $BF_2$ is used to replace the boron, then the energy of the second ion implantation is about 20 to 100 KeV.

Figure 5:
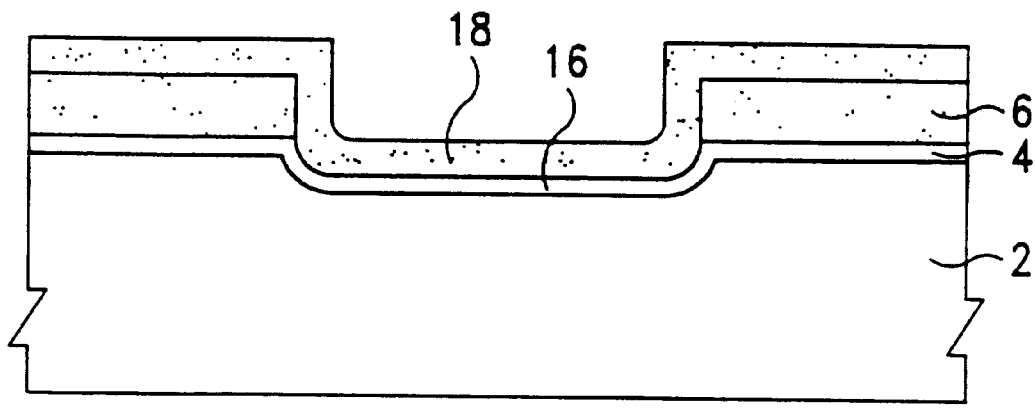
FIG. 5 is a cross-sectional view of a semiconductor wafer illustrating the steps of a second pad oxide and a second silicon nitride layer according to the present invention.

Referring to FIG. 5, a second silicon oxide layer 16 is formed on the surface of the recess portion 12 and on the first silicon nitride layer 6 to serve as a second pad oxide. Further, the second silicon nitride layer 16 is also used for isolation. Similarly, the second pad oxide 16 can be formed by using chemical vapor deposition or thermal oxidation. Successively, a second silicon nitride layer 18 is formed on the second silicon oxide layer 16 at a temperature about 350 to 800 centigrade.

Figure 6:
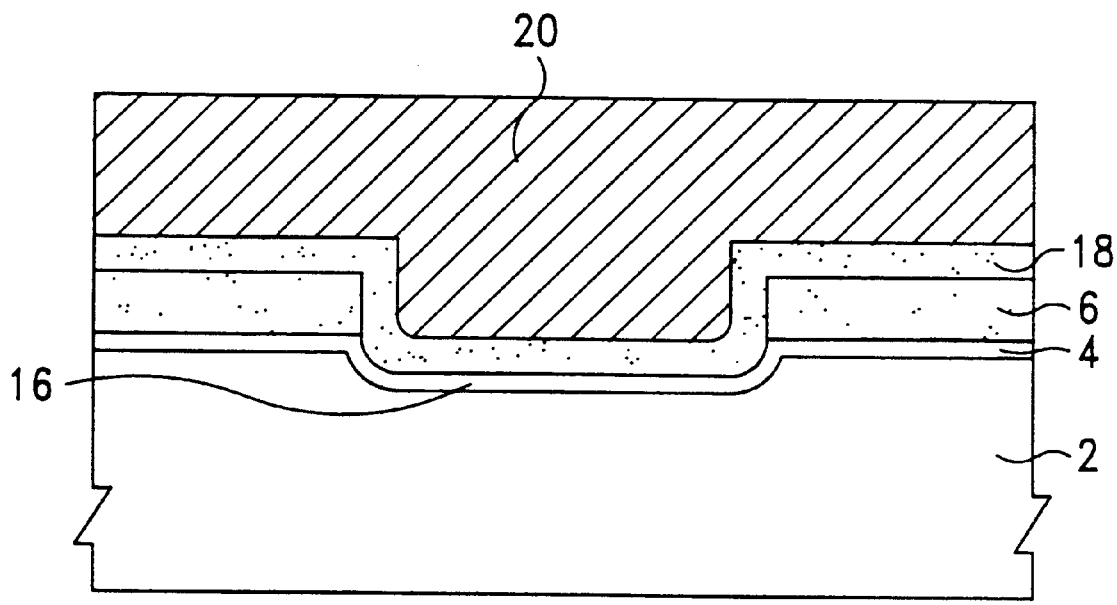
FIG. 6 is a cross-sectional view of a semiconductor wafer illustrating the step of forming a BPSG layer according to the present invention.

Then, a BPSG (borophosphosilicate glass) layer 20 is formed on the second silicon nitride layer 18 and refilled into the recess portion 12 to act as a hard mask for subsequent process. In addition, a spin on glass (SOG) can take place of the BPSG layer 20, as shown in FIG. 6.

Figure 7:
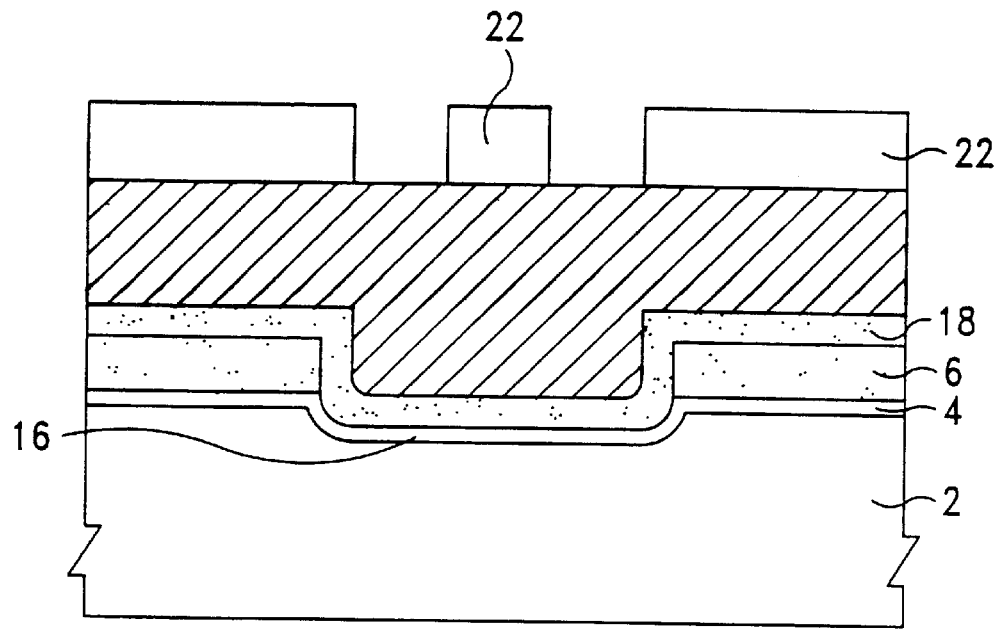
FIG. 7 is a cross-sectional view of a semiconductor wafer illustrating the step of forming a photoresist on the BPSG layer according to the present invention.
Figure 8:
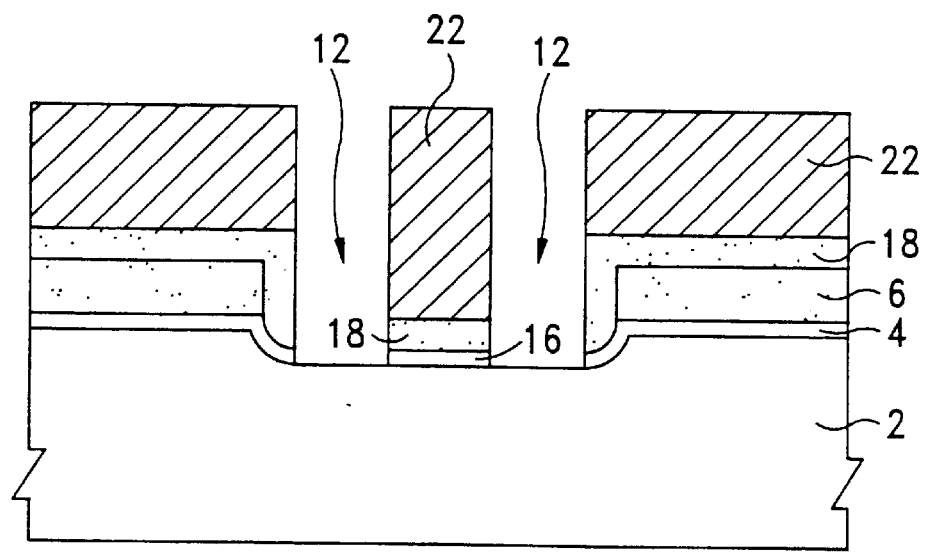
FIG. 8 is a cross-sectional view of a semiconductor wafer illustrating the step of etching the BPSG layer according to the present invention.

A photoresist 22 is then patterned on the BPSG layer 20 to expose portions of the BPSG (borophosphosilicate glass) layer 20. Thus, the area to form trenches is defined by the photoresist 22. Please turn to FIG. 7. The exposed portions are over the recess portion 12. An etching step is next performed to etch the BPSG layer 20, the second silicon nitride layer 18 and the second silicon oxide layer 16 to the surface of the substrate 2. Then, the photoresist 22 is stripped, as shown in FIG. 8.

Figure 9:
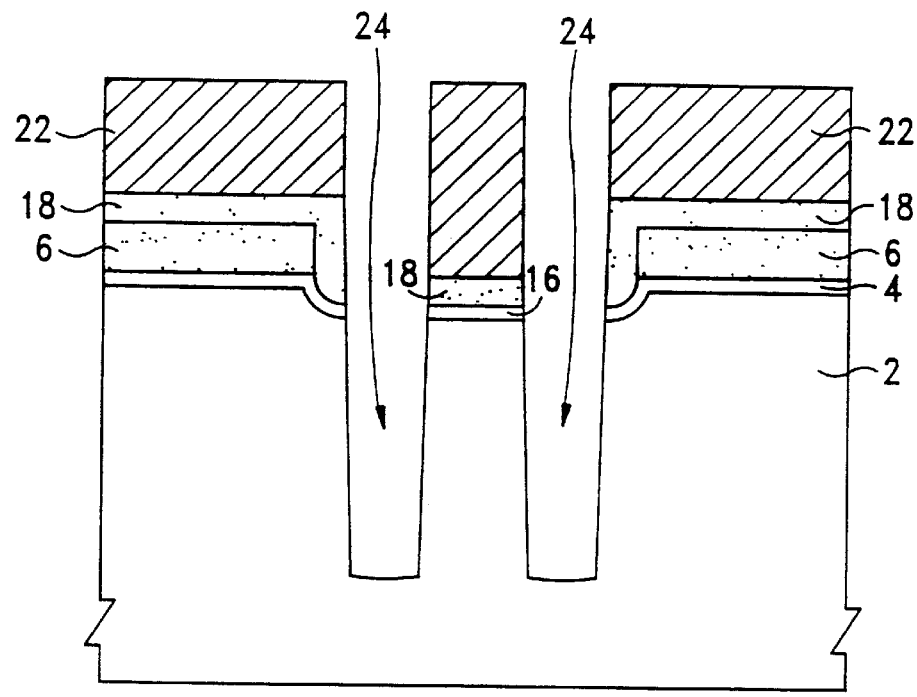
FIG. 9 is a cross-sectional view of a semiconductor wafer illustrating the step of forming trenches in the substrate according to present invention.

Turning to FIG. 9, trenches 24 are then created in the substrate 2 by using the BPSG 22 as the hard mask to etch the substrate 2. The etchant can be chosen from the group of $SiCl_4/Cl_2$, $SF_6$, $HBr/O_2$, $BCl_3/Cl_2$, $HBr/Cl_2/O_2$, $Br_2/SF_6$.

The trenches 24 are formed by using anisotropic etching, such as RIE (reactive ion etch). Next, the BPSG layer 22 is removed.

Figure 10:
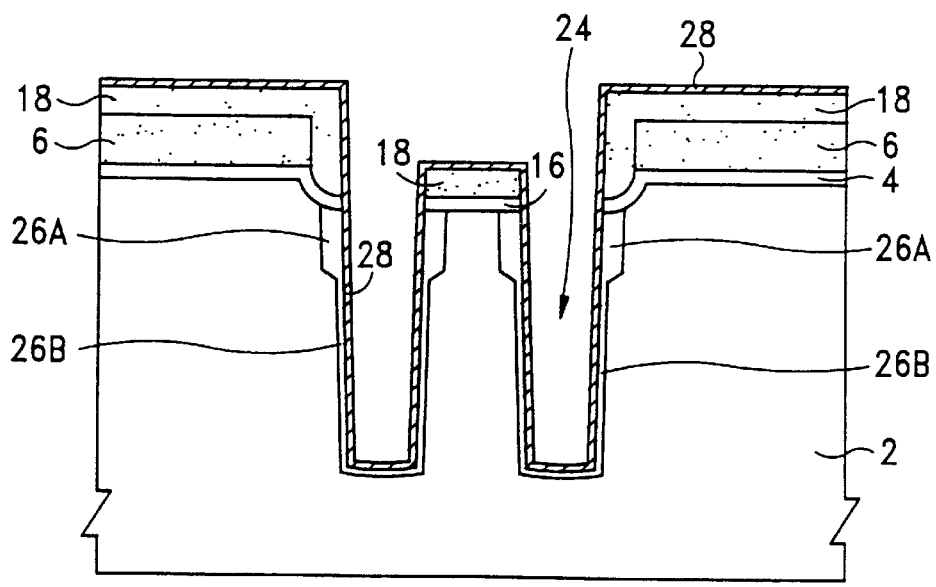
FIG. 10 is a cross-sectional view of a semiconductor wafer illustrating the steps of forming a dielectric film and a first storage node according to of the present invention.

Referring to FIG. 10, then, ion implantation processes are performed with at least two titled angles with respect to the normal (vertical) line of the substrate 2 to dope n type ions, such as arsenic, into the surface of the trenches. Ion doped areas 26A and ion doped areas 26B surround the surface of the trenches 24 to act as a first storage nodes of capacitors, and to form the n+/p junctions for memory cell. The ion doped areas 26A are formed with a larger first titled angle relative to a second titled angle that is used to form the ion doped areas 26B. The first titled angle is oblique from the normal line of the substrate 2 about 20 to 45 degrees. The energy of the ion implantation to form the ion doped areas 26A is about 30 to 120 KeV. The dosage of the ion implantation is about 5E14 to 5E16 atoms/cm$^2$. Further, the doped ion areas 26B are formed with an oblique ion implantation with a second titled angle. The second titled angle is about 3 to 10 degrees from the normal line of the substrate 2. The energy and the dosage of the ion implantation to form the ion doped areas 26B are respectively about 30 to 120 KeV and about 5E14 to 5E16 atoms/cm$^2$.

A dielectric layer 28 is then conformally deposited along the surface of the trenches 24 and on the surface of the second silicon oxide layer 16, the second silicon nitride layer 18. The dielectric layer 28 can be formed of a silicon nitride/silicon oxide double-film, a silicon oxide/ silicon nitride/ silicon oxide triple-film, or any other high dielectric film such as tantalum pentoxide (Ta$_2$O$_5$), BST, PZT.

Figure 11:
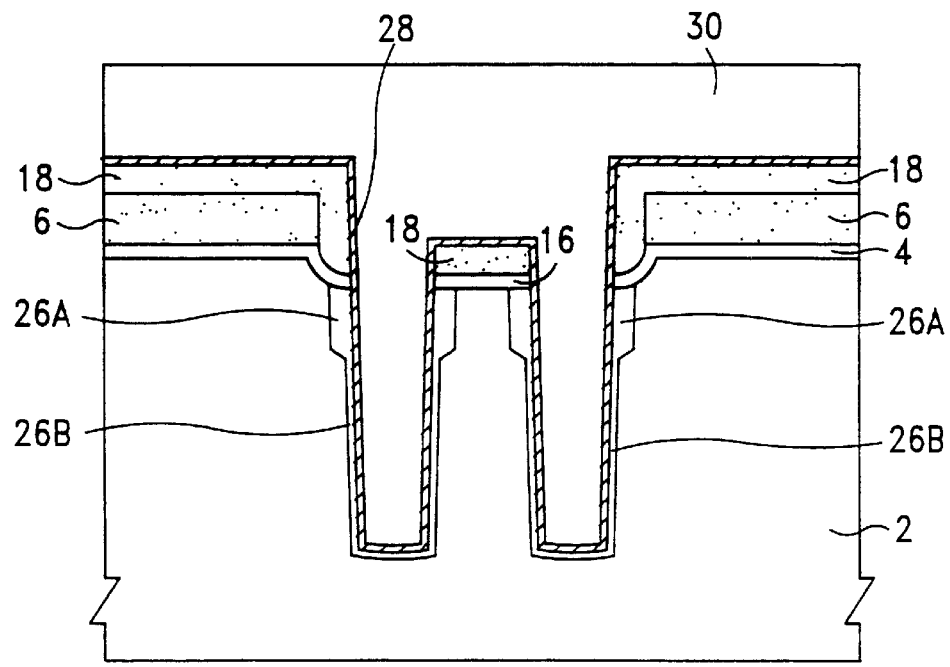
FIG. 11 is a cross-sectional view of a semiconductor wafer illustrating the step of forming a first polysilicon layer according to the present invention.
Figure 12:
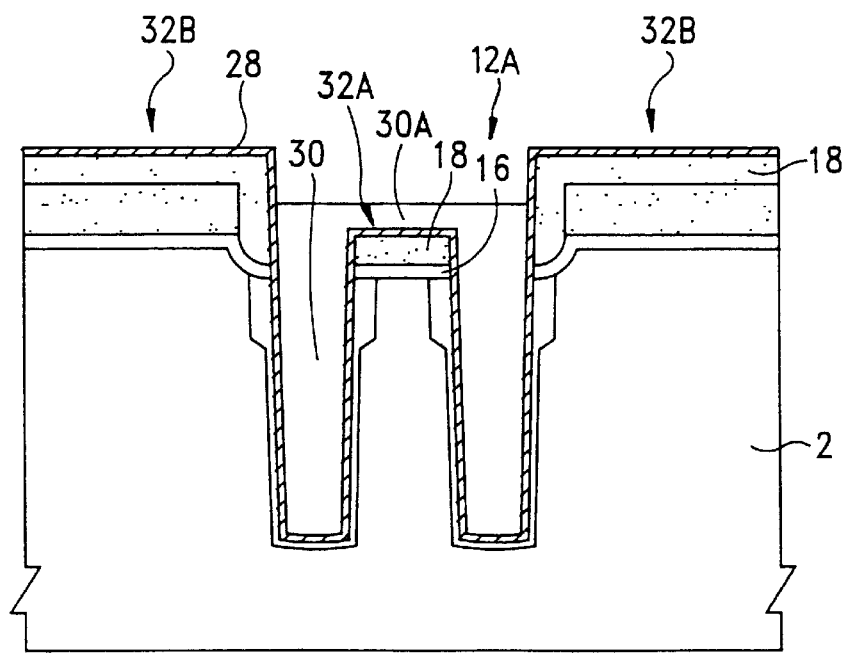
FIG. 12 is a cross-sectional view of a semiconductor wafer illustrating the step of etching the first polysilicon layer according to the present invention.

Afterwards, see FIG. 11, a polysilicon layer 30 is deposited on the dielectric layer 28 and refilled into the trenches 24 using a conventional LPCVD (low pressure chemical vapor deposition) process. Similarly, The polysilicon layer 30 is preferably either doped polysilicon or in-situ doped polysilicon. The thickness of the polysilicon layer 30 is about 5000 to 10000 angstroms. Then an etching back is used to etch the polysilicon layer 30 such that the surface of the polysilicon layer is lower than an opening 12A of the recess portion 12, as shown in FIG. 12. Therefore, a field plate 30A is self-aligned formed on top of the polysilicon layer 30 in the trenches 24 and over the second silicon nitride layer 18. In the step, no mask is used for forming the field plate 330A. The surface of second silicon nitride layer 32A is lower than that of the first silicon nitride layer 18 due to the recess portion 12. Thus, the field plate 330A can be self-aligned formed in the trenches, that is an important feature of the present invention.

Figure 13:
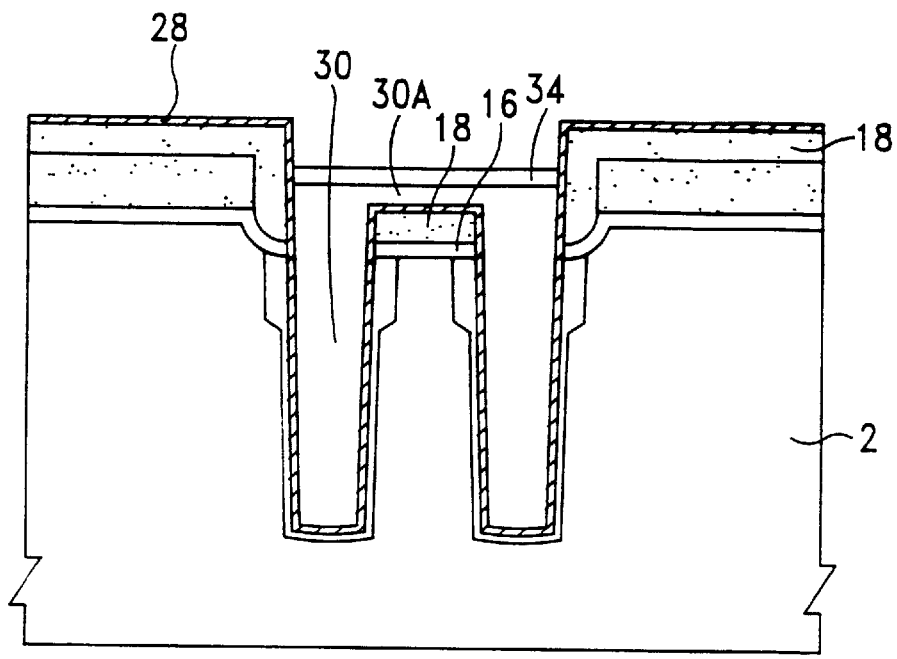
FIG. 13 is a cross-sectional view of a semiconductor wafer illustrating the step of oxidizing the first polysilicon layer according to the present invention.
Figure 14:
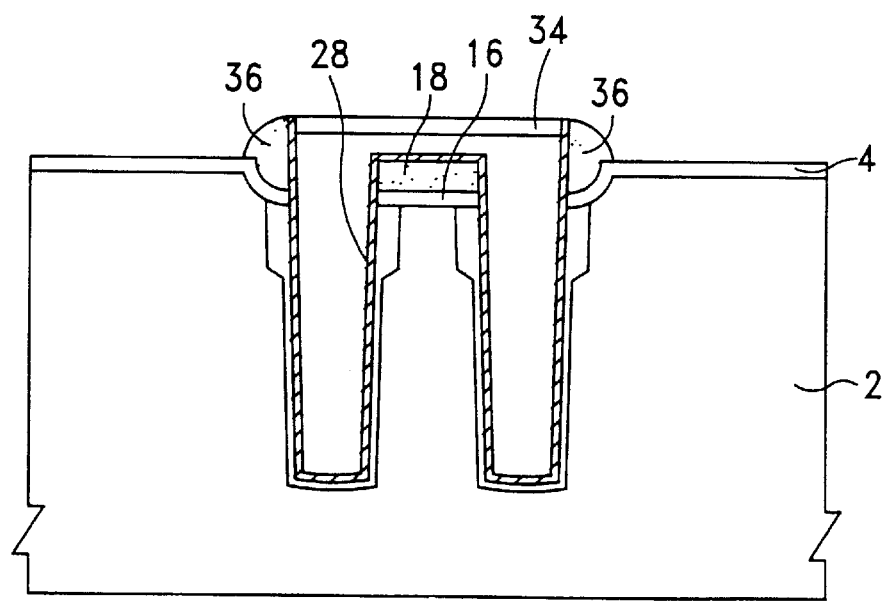
FIG. 14 is a cross-sectional view of a semiconductor wafer illustrating the step of removing a portion of the first silicon nitride layer and the first pad oxide according to the present invention.

Successively, a low temperature thermal process with in wet oxygen steam ambient is carried out at a temperature about 800 to 900 centigrade, please see FIG. 13. Therefore, an inter-level oxide (ILO) layer 34 having about 1000 to 3000 angstroms in thickness is formed on the surface of the field plate 30A for isolation due to the thermal process. Referring to FIG. 14, the dielectric 28, the second silicon nitride layer 18 formed outside the trenches 24, and the first silicon nitride layer 6 are removed to expose the first silicon oxide layer 4 and top portions of the side walls of the polysilicon layer 30. Typically, the silicon nitride can be removed by using hot phosphorus acid solution. After the step is completed, the field plate 30A, the oxide layer 34 are protruding from the wafer 2. In other words, the surface of the oxide layer 34 is higher than that of the first silicon oxide 4. Next, isolation side-wall spacers 36 are formed on the side walls of the field plate 30A, and the oxide layer 34 for preventing the memory cells from leakage. Further, the side-wall spacers 36 are also refilled into portion of the recess portion 12 adjacent to the top of the polysilicon 30. This can be achieved by depositing a dielectric layer on the first silicon oxide layer 4, and the oxide layer 34. Then, an isotropical etching is used to etch the dielectric layer, thereby generating the side-wall spacers 36. In the embodiment, the side-wall spacers 36 are composed of silicon nitride.

Figure 15:
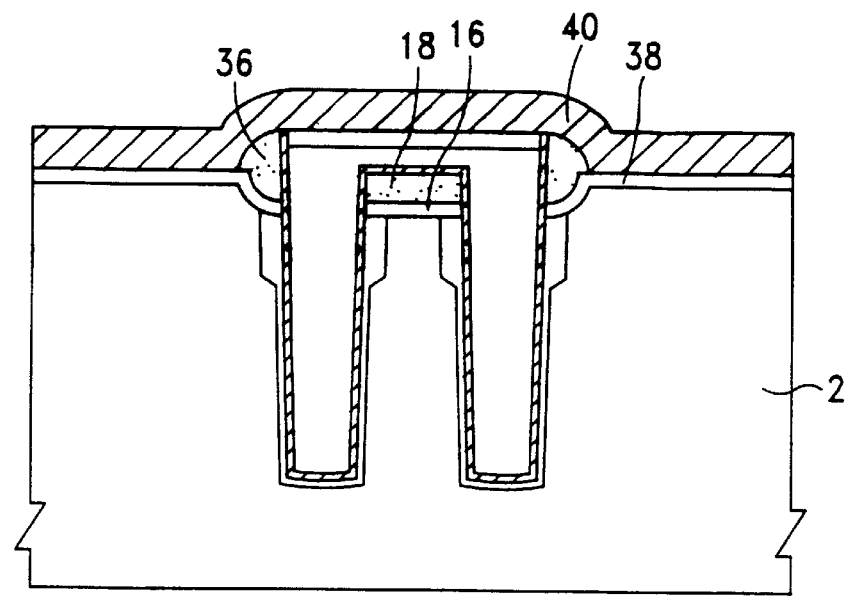
FIG. 15 is a cross-sectional view of a semiconductor wafer illustrating the step of forming a second polysilicon layer according to the present invention.

Turning to FIG. 15, the first silicon oxide 4 that is formed outside the trenches 24 is removed. This can be done by using BOE solution or HF. Next, a silicon oxide layer 38 is reformed on the substrate 2 to act as a gate oxide layer for transistors. Then, a polysilicon layer 40 is formed on the silicon oxide layer 38, the side-wall spacers 36 and the oxide layer 34. The polysilicon layer is formed of doped polysilicon or in-situ polysilicon.

Figure 16:
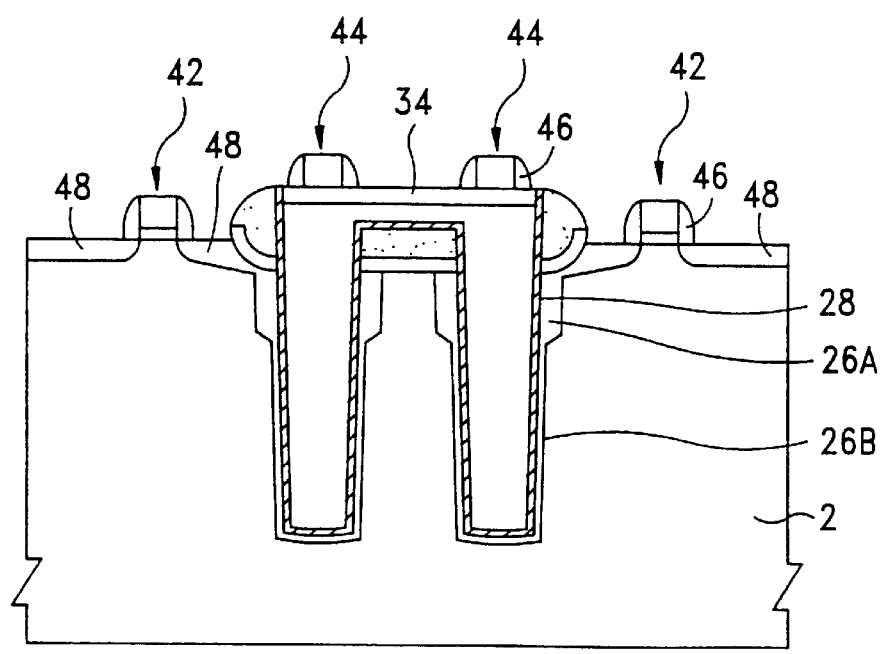
FIG. 16 is a cross-sectional view of a semiconductor wafer illustrating the steps of forming transistors and word lines according to the present invention.

As shown in FIG. 16, lithography and etching processes are used to form the transistors 42, word lines 44. Then, the impurity regions 48 of the transistor 42, the spacers 46 are formed by using well known technology.

As will be understood by persons skilled in the art, the foregoing embodiments of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. A method of forming trench capacitors in a semiconductor substrate, said method comprising:

forming a first pad oxide layer, and a first silicon nitride layer on said semiconductor substrate to expose a portion of said semiconductor substrate, said first silicon nitride layer being formed on said first pad oxide;

forming a recess portion in said semiconductor substrate that is exposed by said first pad oxide layer, and a first silicon nitride layer;

forming a second pad oxide layer on said recess portion;

forming a second silicon nitride layer on said second pad oxide layer and on said first silicon nitride layer;

forming a glass layer on said second silicon nitride layer and refilled into said recess portion;

etching portions of said glass layer, said second silicon nitride layer, said second silicon oxide layer to expose portions of said recess portion;

etching said exposed recess portion using said glass layer as an etching mask to generate trenches in said semiconductor substrate;

performing first ion implantation process with at least two titled angles with respect to a vertical line of said semiconductor substrate to form ion doped regions surrounding said trenches;

forming a dielectric layer along a surface of said trenches;

forming a polysilicon layer into said trenches;

etching said polysilicon layer such that a surface of said polysilicon layer being lower than that an opening of said recess portion, thereby forming a self-aligned field plate on top of said polysilicon layer;

forming an oxide layer on said polysilicon layer;

removing said second silicon nitride layer and said first silicon nitride layer to expose said first silicon oxide layer and top portions of said side walls of said first polysilicon layer; and forming side wall-spacers on top portions of said side walls.

2. The method of claim 1, further comprises following steps to form said recess portion:

forming an field oxide region on said exposed semiconductor substrate; and removing said field oxide region to form said recess portion.

3. The method of claim 2, further comprises a step of performing a second ion implantation before forming said field oxide region.

4. The method of claim 3, wherein an energy of said second ion implantation is about 150 KeV to 2 MeV, a dosage of said second ion implantation is about 1E12 to 5E14 atoms/cm$^2$.

5. The method of claim 1, further comprises a step of performing a third ion implantation after forming said field oxide region to adjust a threshold voltage of memory cells.

6. The method of claim 5, wherein an energy of said third ion implantation is about 5 KeV to 100 KeV, a dosage of said third ion implantation is about 1E12 to 5E13 atoms/cm$^2$.

7. The method of claim 1, wherein said first ion implantation including a first titled angle about 20 to 45 degrees with respect to said vertical line of said semiconductor substrate.

8. The method of claim 7, wherein an energy of said first ion implantation is about 30 KeV to 120 KeV, a dosage of said first ion implantation is about 5E14 to 5E16 atoms/cm$^2$.

9. The method of claim 1, wherein said first ion implantation including a second titled angle about 3 to 10 degrees with respect to said vertical line of said semiconductor substrate.

10. The method of claim 9, wherein an energy of said first ion implantation is about 30 KeV to 120 KeV, a dosage of said first ion implantation is about 5E14 to 5E16 atoms/cm$^2$.

11. The method of claim 1, wherein said oxide layer is formed by thermal process to oxidize said first polysilicon layer at a temperature about 800 to 900 centigrade.

12. The method of claim 1, wherein an etchant to form said trenches are chosen from a group consisting of SiCl$_4$/Cl$_2$, SF$_6$, HBr/O$_2$, BCl$_3$/Cl$_2$, HBr/Cl$_2$/O$_2$, Br$_2$/SF$_6$.

13. The method of claim 1, wherein said first silicon nitride layer and said second silicon nitride layer are removed by hot phosphorus acid solution.

14. The method of claim 1, wherein said polysilicon layer is selected from a group consisting of doped polysilicon and in-situ doped polysilicon.

15. The method of claim 1, wherein said dielectric layer is chosen from a group consisting of tantalum pentoxide (Ta$_2$O$_5$), BST, PZT, a triple film of silicon oxide/silicon nitride/silicon oxide, a double film of silicon nitride/silicon oxide film.

16. The method of claim 1, wherein said glass layer is formed of BPSG (borophosphosilicate glass).

17. The method of claim 1, wherein said glass layer is formed of SOG (spin on glass).

18. A method of forming memory cells in a semiconductor substrate, said method comprising:

forming a first pad oxide layer, and a first silicon nitride layer on said semiconductor substrate to expose a portion of said semiconductor substrate, said first silicon nitride layer being formed on said first pad oxide;

forming a recess portion in said semiconductor substrate that is exposed by said first pad oxide layer, and a first silicon nitride layer;

forming a second pad oxide layer on said recess portion;

forming a second silicon nitride layer on said second pad oxide layer and on said first silicon nitride layer;

forming a glass layer on said second silicon nitride layer and refilled into said recess portion;

etching portions of said glass layer, said second silicon nitride layer, said second silicon oxide layer to expose portions of said recess portion;

etching said exposed recess portion using said glass layer as an etching mask to generate trenches in said semiconductor substrate;

performing first ion implantation process with at least two titled angles with respect to a vertical line of said semiconductor substrate to form ion doped regions surrounding said trenches;

forming a dielectric layer along a surface of said trenches;

forming a first polysilicon layer into said trenches;

etching said first polysilicon layer such that a surface of said first polysilicon layer being lower than that an opening of said recess portion, thereby forming a self-aligned field plate on top of said first polysilicon layer;

forming an oxide layer on said first polysilicon layer;

removing said second silicon nitride layer and said first silicon nitride layer to expose said first silicon oxide layer and top portions of said side walls of said first polysilicon layer;

forming side wall-spacers on top portions of said side walls;

removing said first pad oxide layer;

reforming a third pad layer on said semiconductor substrate;

forming a second polysilicon layer on said third pad layer, said side-wall spacers, said oxide layer; and forming transistors, word lines by etching said second polysilicon layer.

19. The method of claim 18, further comprises following steps to form said recess portion:

forming an field oxide region on said exposed semiconductor substrate; and removing said field oxide region to form said recess portion.

20. The method of claim 19, further comprises a step of performing a second ion implantation before forming said field oxide region.

21. The method of claim 20, wherein an energy of said second ion implantation is about 150 KeV to 2 MeV, a dosage of said second ion implantation is about 1E12 to 5E14 atoms/cm$^2$.

22. The method of claim 18, further comprises a step of performing a third ion implantation after forming said field oxide region to adjust a threshold voltage of memory cells.

23. The method of claim 22, wherein an energy of said third ion implantation is about 5 KeV to 100 KeV, a dosage of said third ion implantation is about 1E12 to 5E13 atoms/cm$^2$.

24. The method of claim 18, wherein said first ion implantation including a first titled angle about 20 to 45 degrees with respect to said vertical line of said semiconductor substrate.

25. The method of claim 24, wherein an energy of said first ion implantation is about 30 KeV to 120 KeV, a dosage of said first ion implantation is about 5E14 to 5E16 atoms/cm$^2$.

26. The method of claim 17, wherein said first ion implantation including a second titled angle about 3 to 10 degrees with respect to said vertical line of said semiconductor substrate.

27. The method of claim 26, wherein an energy of said first ion implantation is about 30 KeV to 120 KeV, a dosage of said first ion implantation is about 5E14 to 5E16 atoms/cm$^2$.

28. The method of claim 18, wherein said oxide layer is formed by thermal process to oxidize said first polysilicon layer at a temperature about 800 to 900 centigrade.

29. The method of claim 18, wherein an etchant to form said trenches are chosen from a group consisting of SiCl$_4$/Cl$_2$, SF$_6$, HBr/O$_2$, BCl$_3$/Cl$_2$, HBr/Cl$_2$/O$_2$, Br$_2$/SF$_6$.

30. The method of claim 18, wherein said first silicon nitride layer and said second silicon nitride layer are removed by hot phosphorus acid solution.

31. The method of claim 18, wherein said first polysilicon layer and said second polysilicon layer are selected from a group consisting of doped polysilicon and in-situ doped polysilicon.

32. The method of claim 18, wherein said dielectric layer is chosen from a group consisting of tantalum pentoxide (Ta$_2$O$_5$), BST, PZT, a triple film of silicon oxide/ silicon nitride/ silicon oxide, a double film of silicon nitride/ silicon oxide film.

33. The method of claim 18, wherein said glass layer is formed of BPSG (borophosphosilicate glass).

34. The method of claim 18, wherein said glass layer is formed of SOG (spin on glass).

* * * * *